US009552508B2

(12) United States Patent
Kim et al.

(10) Patent No.: US 9,552,508 B2
(45) Date of Patent: *Jan. 24, 2017

(54) FINGERPRINT SENSOR MODULE, PORTABLE ELECTRONIC DEVICE INCLUDING SAME, AND METHOD FOR MANUFACTURING SAME

(71) Applicant: Crucialtec Co., Ltd., Asan-si (KR)

(72) Inventors: Jong Uk Kim, Gyeonggi-do (KR); Hyun Kyu Tan, Gyeonggi-do (KR); Sung Ki Lim, Gyeonggi-do (KR); Seok Joon Lee, Seoul (KR); Jae Hak Lee, Gyeonggi-do (KR); Doo Hwan Lee, Gyeonggi-do (KR); Sung Moo Hong, Gyeonggi-do (KR); Jin Young Lee, Seoul (KR)

(73) Assignee: Crucialtec Co., LTD, Asan-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/232,792

(22) Filed: Aug. 9, 2016

(65) Prior Publication Data

US 2016/0350575 A1 Dec. 1, 2016

Related U.S. Application Data

(63) Continuation of application No. 14/443,886, filed as application No. PCT/KR2013/010590 on Nov. 20, 2013, now Pat. No. 9,443,126.

(30) Foreign Application Priority Data

Nov. 20, 2012 (KR) .................. 10-2012-0131704
Dec. 18, 2012 (KR) .................. 10-2012-0148555
Apr. 4, 2013 (KR) .................. 10-2013-0037107

(51) Int. Cl.
*G06K 9/00* (2006.01)

(52) U.S. Cl.
CPC .................. *G06K 9/0002* (2013.01)

(58) Field of Classification Search
CPC .................. H01L 2924/0002; H01L 2924/00; H01L 23/04; H01L 23/24; G06K 9/00053
(Continued)

(56) References Cited

U.S. PATENT DOCUMENTS 9,152,838 B2 10/2015 Wickboldt et al.
2009/0257626 A1* 10/2009 Sherlock ............ G06K 9/00013
382/126

FOREIGN PATENT DOCUMENTS

JP 2010-122015 6/2010
KR 2002-0075087 10/2002
(Continued)

OTHER PUBLICATIONS

Notice of Allowance issued May 11, 2016 in related U.S. Appl. No. 14/443,886.

*Primary Examiner* — Manuchehr Rahmjoo
(74) *Attorney, Agent, or Firm* — H.C. Park & Associates, PLC

(57) ABSTRACT

The present invention relates to a fingerprint sensor module having excellent sensing sensitivity, to a portable electronic device including same, and to a method for manufacturing same. According to one embodiment of the present invention, a fingerprint sensor module is provided which includes: a sensing unit formed on a substrate using a conductive body; a fingerprint sensor having a sensor circuit unit electrically connected to the sensing unit; a bracket accommodating the sensing unit and receiving the fingerprint sensor; and a post-processing layer positioned on a contact surface formed on the bracket so as to face the upper surface of the sensing unit. The sum of the thickness of a supporting layer between the upper surface of the sensing unit and the (Continued)

contact surface, and the thickness of the post-processing layer is 0.04 mm to 0.06 mm.

9 Claims, 12 Drawing Sheets

(58) Field of Classification Search
USPC .......................................................... 382/124
See application file for complete search history.

(56) References Cited

FOREIGN PATENT DOCUMENTS

| KR | 10-2007-0121623 | 12/2007 |
| KR | 10-2012-0106629 | 9/2012 |

* cited by examiner (a)  (b)

(c)

(a)

(b)

(c)

(d)

(a)   (b)   (c)   (d)

FINGERPRINT SENSOR MODULE, PORTABLE ELECTRONIC DEVICE INCLUDING SAME, AND METHOD FOR MANUFACTURING SAME

CROSS-REFERENCE TO RELATED APPLICATIONS

This application is a Continuation of U.S. application Ser. No. 14/443,886, filed on May 19, 2015, which is a U.S. national stage application of International Patent Application No. PCT/KR2013/010590, filed Nov. 20, 2013, which claims priority to Korean Application No. 10-2012-0131704, filed Nov. 20, 2012; 10-2012-0148555, filed Dec. 18, 2012; and 10-2013-0037107, filed Apr. 4, 2013, the disclosures of each of which are incorporated herein by reference in their entirety.

TECHNICAL FIELD

The present invention relates to a fingerprint sensor module, a portable electronic device including the same and a method of manufacturing the same, and more particularly, to a fingerprint sensor module having excellent sensitivity, a portable electronic device including the same, and a method of manufacturing the same.

BACKGROUND ART

As fingerprint sensors are sensors for sensing human finger fingerprints, recently, the fingerprint sensors have been widely used as tools to enhance security in portable electronic devices such as mobile terminals, tablet PCs, etc. That is, since the registration or identification of a user has to be processed by the fingerprint sensors, data stored in the portable electronic devices is protected, and security breaches are prevented.

Meanwhile, in the portable electronic devices, a fingerprint sensor is integrated with a function of navigation which performs an operation of a cursor or pointer and this type of the fingerprint sensor is referred to as a biometric track pad (BTP). In other cases, the fingerprint sensor is integrated with a switching function through which a user inputs information.

Such as a fingerprint sensor is manufactured as a module, in which a fingerprint sensor, integrated circuits (ICs), bezels, etc. are integrated, and mounted on an electronic device.

Meanwhile, in order to mount the fingerprint sensors on various types of electronic devices, the fingerprint sensors are each manufactured as a module type including peripheral components or configurations. Here, the base material of the fingerprint sensor including the fingerprint sensor needs colors in order to match the color of an electronic device, on which the fingerprint sensor module will be mounted, and the color of the fingerprint sensor, or in order for any other reason.

To implement colors on the base material of the fingerprint sensor, a method, such as painting using colored paint, coating using ultraviolet rays (UV), etc., are generally used. However, when colors are implemented on the base material of the fingerprint sensor using a general method, there is a problem in which configurations and thicknesses of interlayers included in a film should be suitably ensured. When the thickness of the film is not fully formed, the implementation of colors is not easy, and also there is a high possibility of generating damage such as contamination, scratches, cracks, etc. The above damage negatively influences an image of a fingerprint sensed by the fingerprint sensor.

Meanwhile, in the fingerprint sensor, and more particularly, in the fingerprint sensor using a capacitive touch method, operability thereof can be changed according to a film thickness formed on the base material of the fingerprint sensor. Particularly, as the film thickness formed on a base material of the fingerprint sensor is greater, sensitivity of the fingerprint sensor is worse, and thus, there is a limitation for the film thickness to implement color thereon.

As described above, there is a tradeoff in general. That is, when an allowable thickness of the film is formed on the base material of the fingerprint sensor to implement color, the operability of the fingerprint sensor is worse, and on the contrary, when the film is formed to be a thin layer so that the operability of the fingerprint sensor is acceptable, desired colors are not obtained or resistance to abrasion is worse.

Recently, fingerprint sensor modules that are minimized and manufactured with a low cost and designed using a chip-on-flex (COF) or ball grid array (BGA) method have been developed in order to mount the fingerprint sensor modules on portable devices. In the fingerprint sensor module, an IC for sensing a fingerprint is separated from a sensing area.

The fingerprint sensor module includes a fingerprint sensor, and a bracket or substrate fixing the fingerprint sensor. Accordingly, a process of coupling the fingerprint sensor to the bracket, in which efficiency and productivity of the process is improved, and a process of the bracket to improve sensitivity are required.

Therefore, a fingerprint sensor module, in which a thickness from a sensing area of the fingerprint sensor to a cover at a final stage being in contact with a user's finger does not influence the function of an electronic device (e.g., the sensitivity of a fingerprint) and also there are no problems for an exterior and reliability of the electronic device, a portable electronic device including the same and a method of manufacturing the same are required.

DISCLOSURE

Technical Problem

The present invention is directed to providing a fingerprint sensor module, which prevents defects at an exterior or a breakdown thereof and has excellent sensitivity, a portable electronic device including the same and a method of manufacturing the same.

Technical Solution

One aspect of the present invention provides a fingerprint sensor module including: a fingerprint sensor having a sensing part formed on a substrate using a conductor and a sensor circuit part electrically connected to the sensing part; a bracket configured to accommodate the sensing part and seat the fingerprint sensor; and a post-processing layer disposed on a contact surface formed on the bracket to face an upper surface of the sensing part, wherein the sum of a thickness of a supporting layer between the upper surface of the sensing part and the contact surface and a thickness of the post-processing layer is in the range of 0.04 to 0.06 mm.

The post-processing layer may include a primer layer, a color paint layer, and a protective layer.

The primer layer may have a thickness of 0.002 to 0.003 mm, the color paint layer may have a thickness of 0.003 to 0.005 mm, and the protective layer may have a thickness of 0.02 to 0.022 mm.

The supporting layer may have a thickness of 0.015 to 0.03 mm.

The fingerprint sensor may be fixed by filling a molding material into the bracket or inserting and coupling with an additional bracket.

Another aspect of the present invention provides a portable electronic device including the above-described fingerprint sensor module.

Still another aspect of the present invention provides a method of manufacturing a fingerprint sensor module, including: a) accommodating a sensing part formed on a substrate of a fingerprint sensor using a conductor in a bracket and seating the fingerprint sensor in the bracket; and b) forming a post-processing layer on a contact surface formed on the bracket to face an upper surface of the sensing part, wherein the sum of a thickness of a supporting layer between the upper surface of the sensing part and the contact surface and a thickness of the post-processing layer is in a range of 0.04 to 0.06 mm.

The forming of the post-processing layer (step b) may include sequentially forming a primer layer, a color paint layer, and a protective layer.

The primer layer may have a thickness of 0.002 to 0.003 mm, the color paint layer may have a thickness of 0.003 to 0.005 mm, and the protective layer may have a thickness of 0.02 to 0.022 mm.

The supporting layer may have a thickness of 0.015 to 0.03 mm.

Before forming the post-processing layer (step b), the method may further include polishing the contact surface.

After seating the fingerprint sensor in the bracket (step a), the method may include fixing the fingerprint sensor by filling a molding material into the bracket or inserting and coupling with an additional bracket.

Yet another aspect of the present invention provides a fingerprint sensor module including: a fingerprint sensor having a sensing part formed on a substrate using a conductor and a sensor circuit part electrically connected to the sensing part; a bracket having a groove and configured to accommodate and seat the fingerprint sensor by pressing the sensing part in the groove; and a molding material configured to fill an empty space of the groove and cover the sensor circuit part and the sensing part.

Yet another aspect of the present invention provides a method of manufacturing a fingerprint sensor module, including: a) coating a predetermined amount of epoxy adhesive into a groove formed on a bracket; b) accommodating a sensing part formed on a substrate of a fingerprint sensor using a conductor in the groove by pressing with a jig, and seating the fingerprint sensor in the bracket; and c) separating the jig and filling a molding material into an empty space of the groove to cover the sensor circuit part and the sensing part.

Yet another aspect of the present invention provides a fingerprint sensor module including: a fingerprint sensor having a sensing part formed on a substrate using a conductor and a sensor circuit part electrically connected to the sensing part; a first bracket configured to accommodate the fingerprint sensor to support the sensing part; and a second bracket configured to form a supporting layer on an upper surface of the sensing part and fix the fingerprint sensor and the first bracket.

Yet another aspect of the present invention provides a method of manufacturing a fingerprint sensor module, including: a) supporting a fingerprint sensor by a first bracket to support a sensing part; and b) fixing the fingerprint sensor so that a second bracket is coupled to an upper surface of the first bracket to form a supporting layer on an upper surface of the sensing part.

Yet another aspect of the present invention provides a fingerprint sensor module including: a fingerprint sensor having a sensing part formed on a substrate using a conductor and a sensor circuit part electrically connected to the sensing part; and a bracket configured to accommodate the sensing part and seat the fingerprint sensor, wherein the bracket has a supporting layer between the sensing part upper surface and a contact surface of the bracket, and the supporting layer includes a ferroelectric.

Yet another aspect of the present invention provides a method of manufacturing a fingerprint sensor module, including: a) providing a bracket; and b) accommodating a sensing part formed on a substrate of a fingerprint sensor using a conductor in the bracket to seat the fingerprint sensor in the bracket, wherein the bracket has a supporting layer between the sensing part upper surface and a contact surface of the bracket, and the supporting layer includes a ferroelectric.

Yet another aspect of the present invention provides a fingerprint sensor module including a fingerprint sensor having a sensing part formed on a substrate using a conductor and a sensor circuit part electrically connected to the sensing part; a bracket configured to accommodate the sensing part and seat the fingerprint sensor; and a post-processing layer disposed on a contact surface formed on the bracket to face an upper surface of the sensing part, wherein the post-processing layer includes a primer layer, a color paint layer, and a protective layer, and the protective layer includes a ceramic coating layer including a ceramic.

Yet another aspect of the present invention provides a method of manufacturing a fingerprint sensor module, including: a) accommodating a sensing part formed on a substrate of a fingerprint sensor using a conductor and a sensor circuit part electrically connected to the sensing part in a bracket and seating the fingerprint sensor in the bracket; and b) forming a post-processing layer on a contact surface formed on the bracket to face an upper surface of the sensing part, wherein the post-processing layer includes a primer layer, a color paint layer, and a protective layer, and the protective film layer includes a ceramic coating layer including ceramic.

Advantageous Effects

According to one embodiment of the present invention, a fingerprint sensor module, which is firmly modularized and also has improved sensitivity, a portable electronic device including the same, and a method of manufacturing the same can be provided.

Particularly, a fingerprint sensor module capable of stably supporting a fingerprint sensor designed using a COF or BGA method, a portable electronic device including the same, and a method of manufacturing the same can be provided.

Further, according to one embodiment of the present invention, a fingerprint sensor module, in which an upper surface thereof is effectively manufactured and also there are no problems for the exterior, functions, and reliability of the electronic device, a portable electronic device including the same, and a method of manufacturing the same can be provided.

Furthermore, according to one embodiment of the present invention, as the sum of the thickness of a supporting layer and the thickness of a post-processing layer is managed within 0.04 mm or more but 0.06 mm or less, available sensing can be effectively performed when a fingerprint is sensed.

The effects of the present invention are not limited to the above, and it will be understood to include all effects estimable from the spirit and scope of the present invention or from configurations defined by the appended claims.

Figure 1:
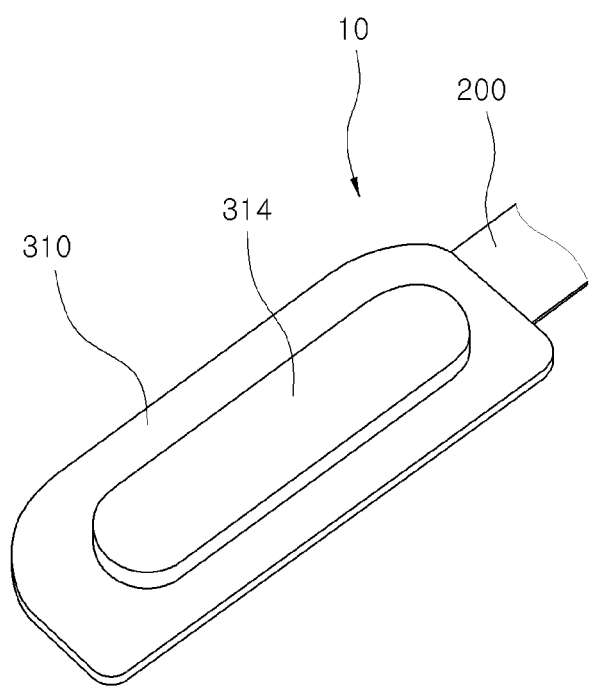
FIG. 1 is a perspective view illustrating a fingerprint sensor module according to one embodiment of the present invention.

NUMERALS IN THE DRAWINGS OF THE INVENTION 10, 3010: FINGERPRINT SENSOR MODULE
200, 1200, 2200: FINGERPRINT SENSOR
220, 1220, 2220: SENSOR CIRCUIT PART
310, 4310: BRACKET
312: GROOVE
314: CONTACT SURFACE
315, 3315: SUPPORTING LAYER
340: JIG
350: MOLDING MATERIAL
360: METAL PLATE
400: FERROELECTRIC
500, 3500: POST-PROCESSING LAYER
502: PRIMER LAYER
503: COLOR PAINT LAYER
504: PROTECTIVE LAYER
3310: FIRST BRACKET
3320: SECOND BRACKET
4320: ADDITIONAL BRACKET

MODES OF THE INVENTION

Hereinafter, exemplary embodiments of the present invention will be described in detail with reference to the accompanying drawings so as to enable one skilled in the art to which the present invention pertains to easily carry out. However, the present invention may be embodied as various different forms and is not limited to the embodiments described herein. In order to clearly describe the present invention, in addition, a structure and an element which do not relate to the detail description are not shown in the drawings, and the similar elements in the following description are designated by the similar reference numeral.

In the following description, it will be understood that when an element or layer is referred to as being "on," "connected to," or "coupled with" another element or layer, it can be directly on, connected, or coupled to the other element or layer or intervening elements or layers may be present. In addition, when there is an expression that some portion "includes" some structural elements, this means that some portion does not exclude another structural element, but may further another structural element unless referred to the contrary.

Hereinafter, embodiments of the present invention will be described with reference to accompanying drawings in detail.

FIG. 1 is a perspective view illustrating a fingerprint sensor module according to one embodiment of the present invention.

As shown in FIG. 1, a fingerprint sensor module 10 may include a bracket 310 and a fingerprint sensor 200. Here, the fingerprint sensor 200 is installed inside of the fingerprint sensor module 10 and not externally shown.

The fingerprint sensor module 10 may be included in an electronic device, and more particularly, in a portable electronic device. Here, the portable electronic device includes a mobile terminal, a smartphone, a personal digital assistance (PDA), a tablet personal computer (PC), a notebook computer, a portable sound player (MP3 player), and all portable electronic devices similar to the described above.

The bracket 310 is a member in which the fingerprint sensor 200 is accommodated and seated, and forms an overall shape of the sensor module 10 in addition to protecting the fingerprint sensor module 10. The bracket 310 may be a molding product formed by molding. A contact surface 314 of the bracket 310 is a portion touched by a user and receives a signal transferred though the user (the user's finger.)

The bracket 310 may be formed of one of an epoxy molding compound (EMC), fluoride resin, and nylon or polyamide including 20 to 40% glass. Here, the glass increases the strength of the bracket to protect the fingerprint sensor from an external impact. However, when the percent of glass is high, there is a high possibility of generating defects when a mechanical process is performed. Thus, 20 to 40% of the glass is preferable. Further, the fluoride resin may be polyvinylidene difluoride (PVDF) having a high permittivity.

Figure 2:
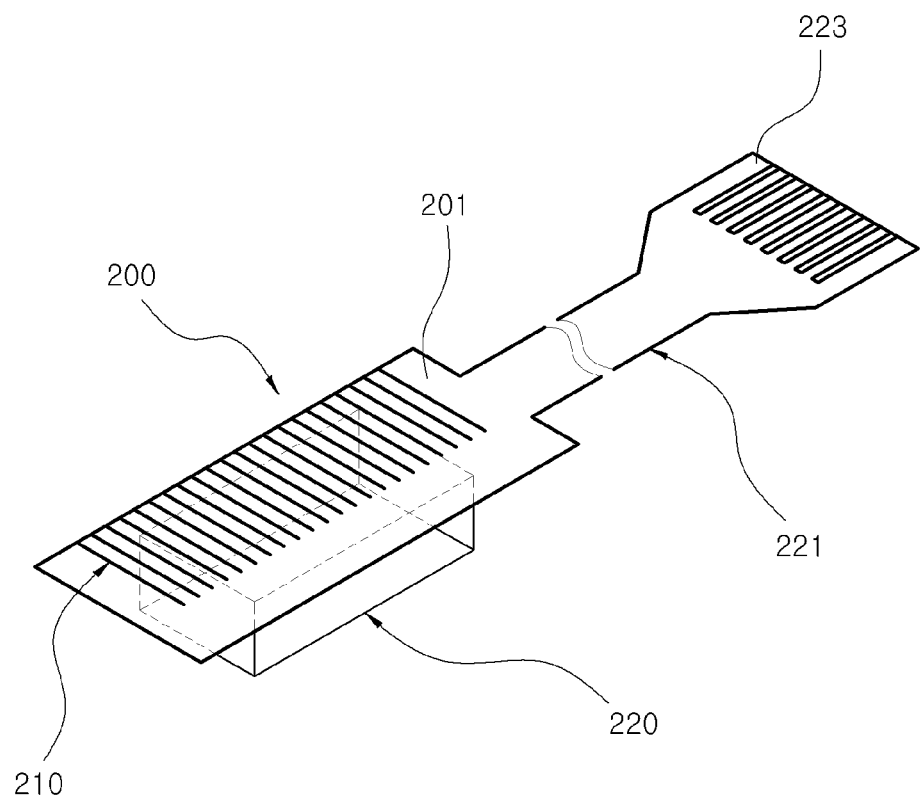
FIG. 2 is a view illustrating a fingerprint sensor according to one embodiment of the present invention.
Figure 3:
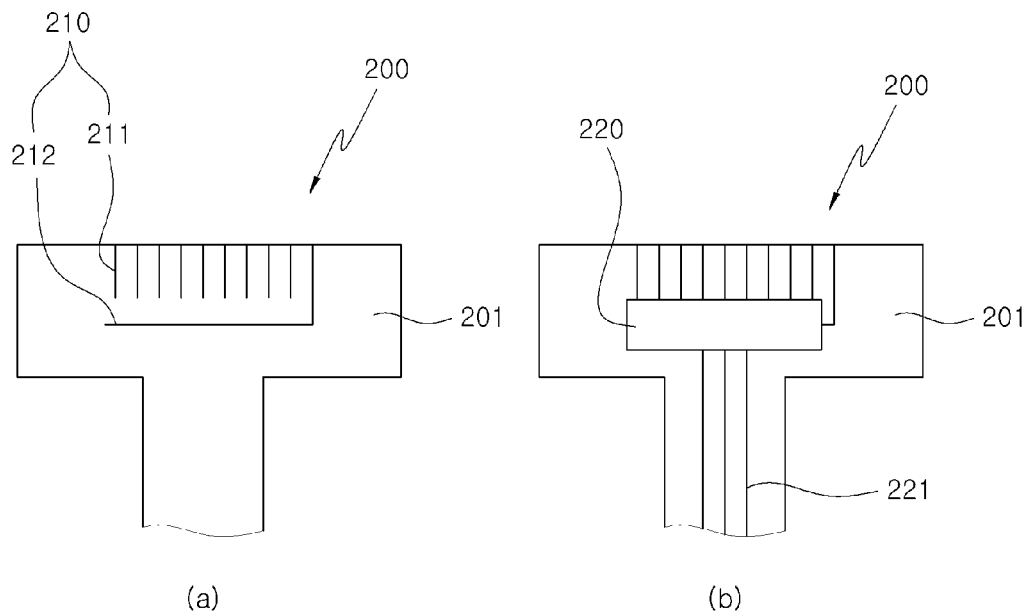
FIG. 3 is a schematic view illustrating a configuration of the fingerprint sensor according to one embodiment of the present invention.
Figure 3:
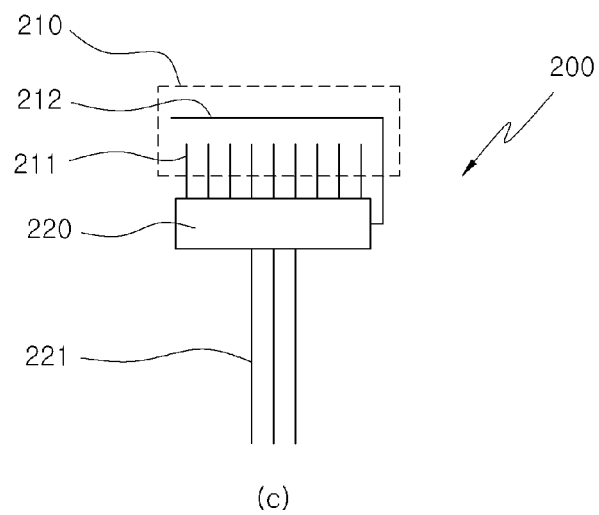
Figure 4:
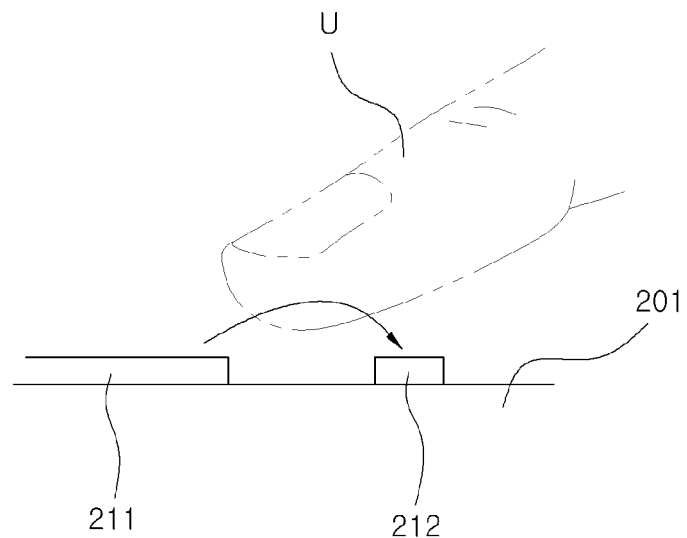
FIG. 4 is a schematic view for describing an operation of the fingerprint sensor according to one embodiment of the present invention.

FIG. 2 is a view illustrating a fingerprint sensor according to one embodiment of the present invention. FIG. 3 is a schematic view illustrating a configuration of the fingerprint sensor according to one embodiment of the present invention. FIG. 4 is a schematic view for describing an operation of the fingerprint sensor according to one embodiment of the present invention.

First, as shown in FIG. 2, a fingerprint sensor 200 may include a substrate 201 formed of a flexible material, a sensing part 210, a sensor circuit part 220, and external interface connection part 221.

The sensing part 210 may include a driving electrode and a receiving electrode formed of a conductor and may be installed inside of the substrate 201. The sensing part 210 may receive a difference between electrical signals of valleys and ridges included in the fingerprint of a finger disposed on the substrate 201.

Since the substrate 201 is formed with a flexible printed circuit board (FPCB) formed of a flexible material, the driving electrode and the receiving electrode may be protected and also serve as a substrate of the sensor circuit part 220.

The sensor circuit part 220 is an integrated circuit (IC) in which electronic circuits for sensing and processing a fingerprint image are integrated, and electrically connected to the driving and receiving electrodes of the sensing part 210. Since the substrate 201 is formed with a FPCB, the circuit part 220 may be mounted on a lower surface of the substrate 201.

The external interface connection part 221 is formed by extending the FPCB of the above-described substrate 201. Wirings are formed inside of the external interface connection part 221 in which a connector 223 is formed on one end thereof so as to be in contact with an external interface.

Meanwhile, as shown in FIG. 3, the fingerprint sensor 200 may include a sensing part 210 provided on an upper surface of the substrate 201, and a sensor circuit part 220 provided on a lower surface of the substrate 201. FIG. 3(A) is the upper surface of the substrate 201, FIG. 3(B) is a lower surface of the substrate 201, and FIG. 3(C) is a configuration view illustrating an electrical connection relation between the sensing part 210 and the sensor circuit part 220.

The substrate 201 may be a flexible substrate, e.g., formed with a polymide layer, but is not limited thereto.

The sensing part 210 includes a plurality of driving electrodes 211 and an image receiving electrode 212 formed on the substrate 201. The driving electrodes 211 and the image receiving electrode 212 may be formed with conductive lines.

The driving electrode 211 receives a driving signal from the sensor circuit part 220 and transmits the signal to the image receiving electrode 212. The image receiving electrode 212 receives a signal transferred through the driving electrode 211 and a user (the user's finger.)

One end of the image receiving electrode 212 disposed on the upper surface of the substrate 201 is formed to extend in a lateral direction. The plurality of driving electrodes 211 are formed to be spaced apart from each other and to extend in parallel so as to be perpendicular to the extending direction of the image receiving electrode 212 (see FIG. 3(A).) The image receiving electrode 212 is electrically connected to the sensor circuit part 220 on the lower surface of the substrate 201.

One end of each of the plurality of driving electrodes 211 is located at an area which is spaced apart from the image receiving electrode 212 by a predetermined distance. Further, the other end of each of the plurality of driving electrodes 211 is electrically connected to the sensor circuit part 220 on the lower surface of the substrate 201.

As shown in FIG. 4, the driving electrodes 211 are spaced apart from the image receiving electrode 212, and a driving signal received by the driving electrode 211 is transmitted to the image receiving electrode 212 through a user U. At this time, the variation of electric fields according to valleys and ridges included in the fingerprint of the finger of the user U is measured as a signal so as to recognize the fingerprint.

Referring again to FIGS. 3(B) and 3(C), the sensor circuit part 220 may have an external interface connection part 221 which may be electrically connected to an external device. For example, the external interface connection part 221 may be connected to a portable device such as a smartphone.

As described above, the fingerprint sensor 200 is implemented by a chip-on-flex (COF) or ball grid array (BGA) method. Particularly, only the sensing part 210, i.e., the driving electrode 211 and the image receiving electrode 212, is formed on the upper surface of the substrate 201 and the sensor circuit part 220 connecting to the sensing part 210 is installed on the lower surface of the substrate 201, and thus, an IC of the sensor circuit part 220 may be formed to be a small. Accordingly, the sensing part 210 can be installed without a spatial limitation, and the overall size of an exterior of the fingerprint sensor can be formed to have a compact size.

Further, since the sensor circuit part is not provided on the upper surface of the substrate 201, glass can be easily installed on the fingerprint sensor module and this is very useful for portable electronic devices such as smartphones.

Figure 5:
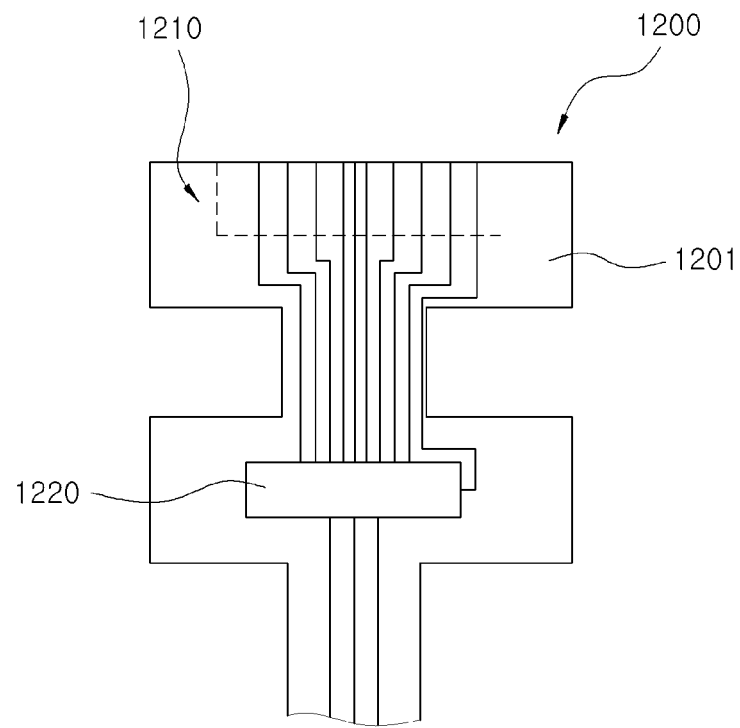
FIG. 5 is a schematic view illustrating a fingerprint sensor included in a fingerprint sensor module according to another embodiment of the present invention.

Meanwhile, FIG. 5 is a schematic view illustrating a fingerprint sensor included in a fingerprint sensor module according to another embodiment of the present invention. As shown in FIG. 5, a sensor circuit part 1220 of a fingerprint sensor 1200 may be installed in an area far away from a sensing part 1210. That is, while the above-described sensor circuit part 1220 is disposed inside of the bracket (see 310 in FIG. 1), the sensor circuit part 1220 shown in FIG. 5 may be installed outside of the bracket. Accordingly, an impact and heat generated when the bracket is coupled to the fingerprint sensor 1200 and the fingerprint sensor 1200 is fixed are prevented from being directly applied to the sensor circuit part 1220. Further, since the sensor circuit part 1220 may be installed in any area of a substrate 1201, the sensor circuit part can be easily installed and applied according to the structural characteristics of a portable electronic device.

The fingerprint sensor may be formed as an integrated type, in which the sensor circuit part is integrated with the sensing part, in addition to a separate type in which the sensor circuit part is separated from the sensing part as the described above.

Figure 6:
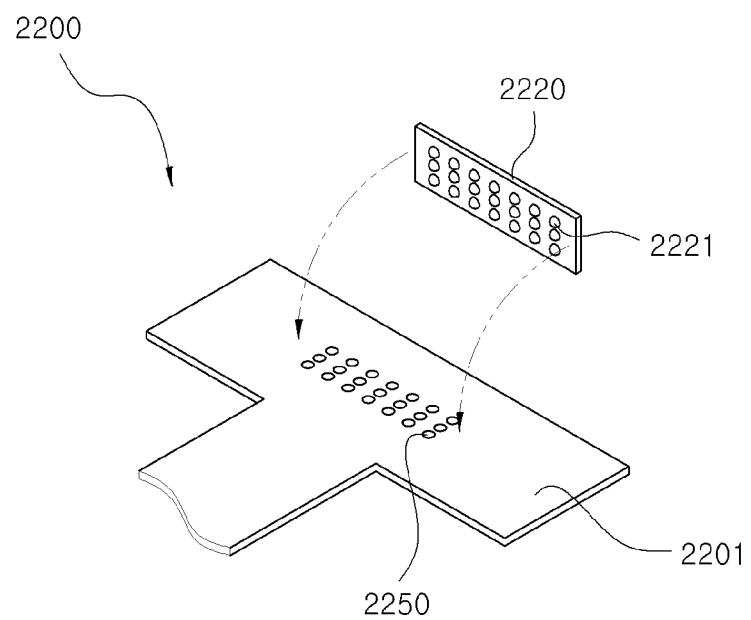
FIG. 6 is a schematic view illustrating a fingerprint sensor included in a fingerprint sensor module according to still another embodiment of the present invention.

FIG. 6 is a schematic view illustrating a fingerprint sensor included in a fingerprint sensor module according to still another embodiment of the present invention. As shown in FIG. 6, a fingerprint sensor 2200 may be formed as a BGA type.

That is, terminals 2250 in a 2-dimensional array shape are arranged on a substrate 2201, and bumps 2221 formed on a lower surface of a sensor circuit part 2220 may be formed to be connected to the terminals 2250. The terminals 2250 may be connected to the respective bumps 2221 by soldering.

For example, the substrate 2201 may be a printed circuit board (PCB) to electrically connect to the sensor circuit part 2220 described below so as to transmit electrical signal information. Although not shown in the drawings, lead frames may be attached on a lower surface of the substrate 2201 by a resin injection or surface mounting technology (SMT) method.

Although the above-described fingerprint sensor is mainly described based on a separate type, an area type, in which image receiving part is provided in the plural, is also included in the scope of the present invention when the sensor circuit part is integrated with the sensing part.

Figure 7:
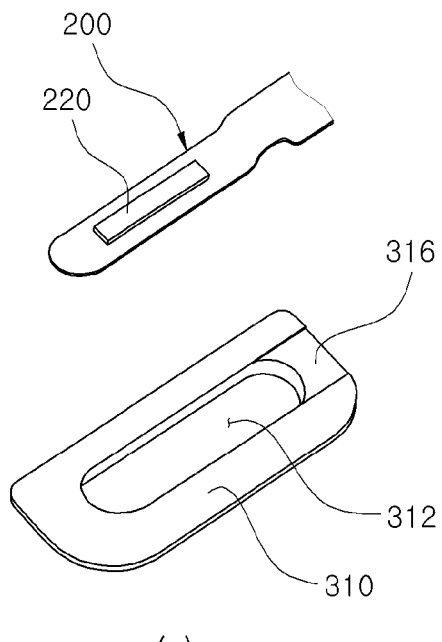
FIG. 7 is a view for describing a process of manufacturing the fingerprint sensor module according to one embodiment of the present invention.
Figure 7:
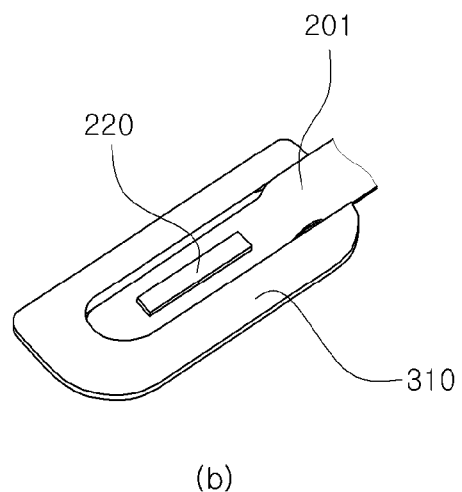
Figure 7:
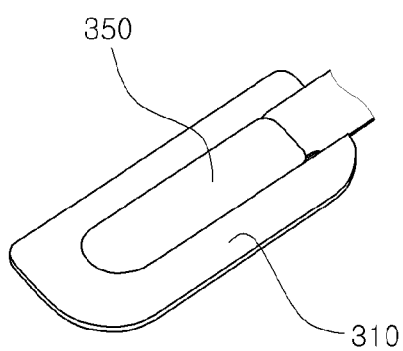
Figure 7:
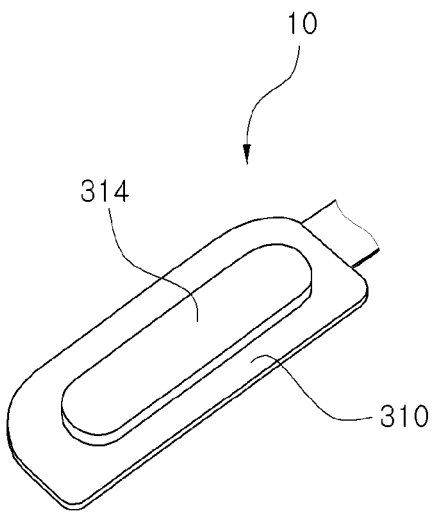
Figure 8:
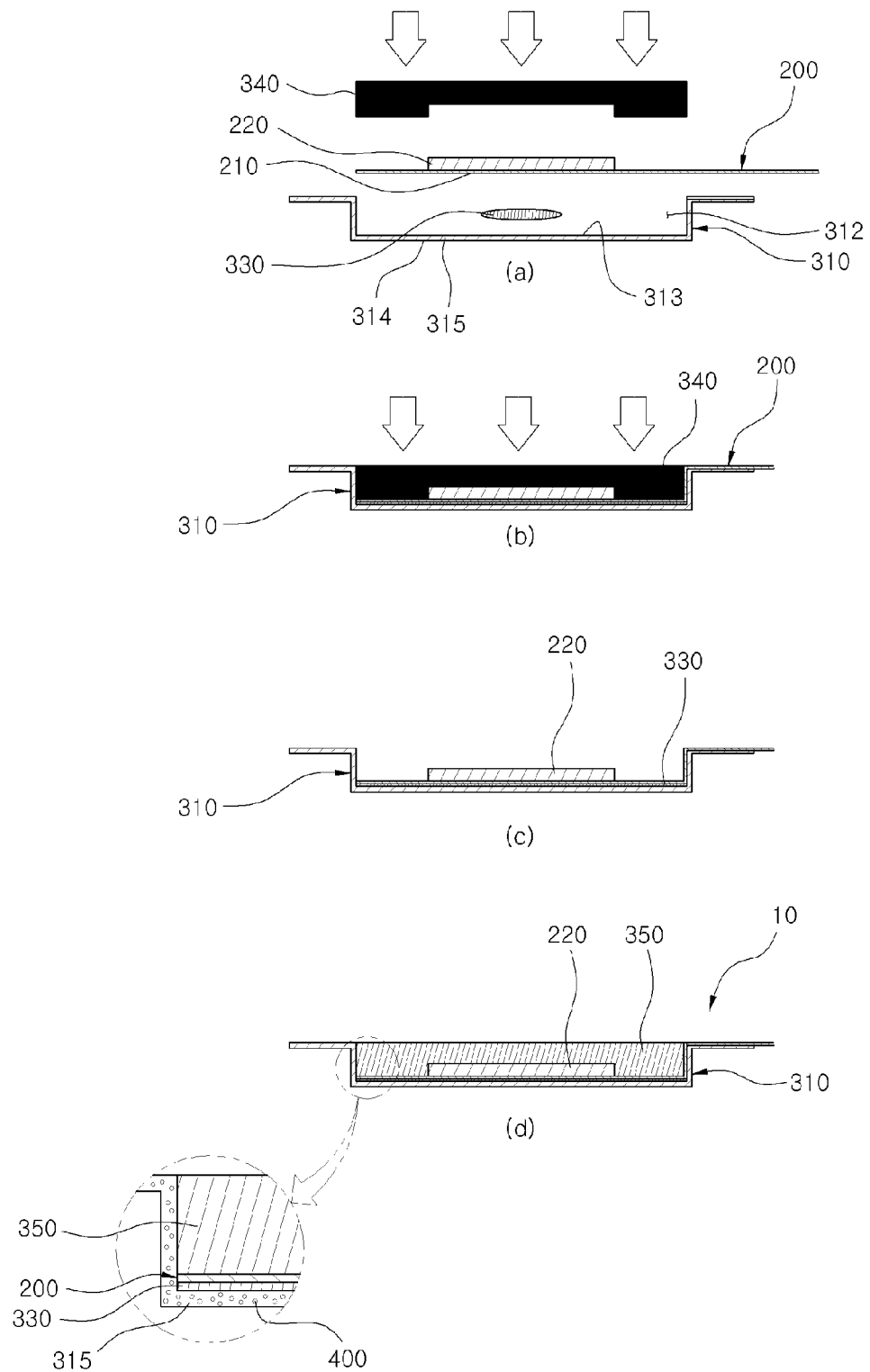
FIG. 8 is a cross sectional view for describing a process of manufacturing the fingerprint sensor module according to one embodiment of the present invention.

FIG. 7 is a view for describing a process of manufacturing the fingerprint sensor module according to one embodiment of the present invention. FIG. 8 is a cross sectional view for describing a process of manufacturing the fingerprint sensor module according to one embodiment of the present invention.

First, as shown in FIG. 7(A) and FIG. 8(A), a fingerprint sensor module 10 according to one embodiment of the present invention includes a bracket 310 in which a fingerprint sensor 200 is seated. The bracket 310 has a groove 312 therein, and a contact surface 314 (see FIG. 7(D)) opposite a surface having the groove 312 is formed to protrude against a shape of the groove 312.

The bracket 310 may have a supporting layer 315 between a lower surface 313 of the groove 312 and the contact surface 314, and the thickness of the supporting layer 315 may be in a range of 0.015 to 0.03 mm. Here, the thickness of the supporting layer 315 is vertically measured from the groove 312 to the contact surface 314. That is, the supporting layer 315 may have a thickness between an upper surface of the sensing part 210 and the contact surface 314. The fingerprint sensor 200 may be unstably accommodated when the thickness of the supporting layer 315 is small, and on the other hand, the sensitivity of the fingerprint sensor 200 may be degraded when the thickness of the supporting layer 315 is great.

A ferroelectric 400 capable of increasing a permittivity may be included in the supporting layer 315. That is, when the permittivity is high, a fingerprint sensor may reduce a signal loss when an image is received in an active state thereof, and thus, the thicknesses of the supporting layer 315 and a post-processing layer (see 500 in FIG. 9) described below may be freely implemented.

Hereinafter, it will be described with respect to the ferroelectric 400 in detail. The ferroelectric 400 is one of dielectrics which are electrical insulators, and generally referred to as a material in which electric polarization of dividing into positive and negative electrodes occurs by itself even when an external voltage is not applied. The representative materials are $Al_2O_3$, $BaTiO_3$ (BTO), $SrTiO_3$ (STO), $(Ba,Sr)TiO_3$ (BST), etc.

The ferroelectric 400 in a powder or liquid state may be mixed with the bracket 310 to be included in the entire bracket 310, and thus, the bracket 310 may be implemented with an EMC mold including the ferroelectric 400. The EMC mold including the ferroelectric 400 may be applied to a fingerprint sensor in a chip-on-board (COB) type and a fingerprint sensor in a wafer level package (WLP) type in addition to the fingerprint sensor in the COF type formed by the flexible substrate according to the embodiment of the present invention.

As described above, the ferroelectric 400 is preferably included in the supporting layer 315, but may be included in the entire bracket 310 for the convenience of a process.

Further, the bracket 310 may be formed of one of an EMC, fluoride resin, and nylon or polyamide including 20 to 40% glass. Further, the fluoride resin may be PVDF having a high permittivity. That is, when the permittivity is high, a sensing signal may be amplified and a fingerprint is easily recognized, and a post-process may be freely performed without a thickness limitation.

A sensing part 210 and a sensor circuit part 220 of the fingerprint sensor 200 are accommodated in the groove 312. Here, a predetermined amount of epoxy resin 330 serving as an adhesive may be injected in the groove 312 in advance.

Then, as shown in FIG. 7(B) and FIG. 8(B), the sensor circuit part 220 of the fingerprint sensor 200 is upwardly seated by supporting of a flexible substrate 201 disposed on a step difference 316 formed on an edge of the groove 312. In this process, the fingerprint sensor 200 is pressed and seated using a jig 340 which has a shape the same as an exterior shape of the fingerprint sensor 200.

After the fingerprint sensor 200 is seated, as shown in FIG. 8(C), the jig 340 is separated from the groove 312.

Subsequently, as shown in FIGS. 7(C), 7(D), and 8(D), after the jig 340 is separated, the groove 312 of the bracket 310 is filled with a molding material 350. As shown in FIG. 7(B), the sensing part 210 and the sensor circuit part 220 are accommodated in the groove 312, and an empty space exists in addition to the accommodated area in the groove. When the empty space remains, the fingerprint sensor 200 may not be fixed and may move in the empty space, and thus, the empty space is filled with the molding material 350. The molding material 350 may include a polymer in a liquid state, and for example, one of EMC, epoxy resin, and putty may be used. The EMC may include EMC in a liquid state. The EMC is harder than a polycarbonate (PC) base formed by general injection so as to prevent a tolerance and further improve flatness. In addition, chip marks generated when general injection is performed may be reduced after a thermal process is performed at a high temperature. The molding material 350 closely attaches the sensing part 210 onto the bottom of the groove 312, thereby increasing the reliability of the fingerprint sensor 200.

Meanwhile, the molding material may be a mechanism having a certain shape. Like a polymer in a liquid state, the mechanism may also fix the fingerprint sensor 200 and the reliability of the sensor may be improved. The mechanism may be designed to fit in the groove 312 and pressed therein, or coupled to the groove using a separate coupling tool. An example in which the molding material having a certain shape is used will be described below (see FIG. 13.)

FIG. 7(D) is a view in which the bracket 310 shown in FIG. 7(C) was turned over. As described above, the contact surface 314 opposite the groove 312 is formed to protrude against the shape of the groove 312.

Figure 9:
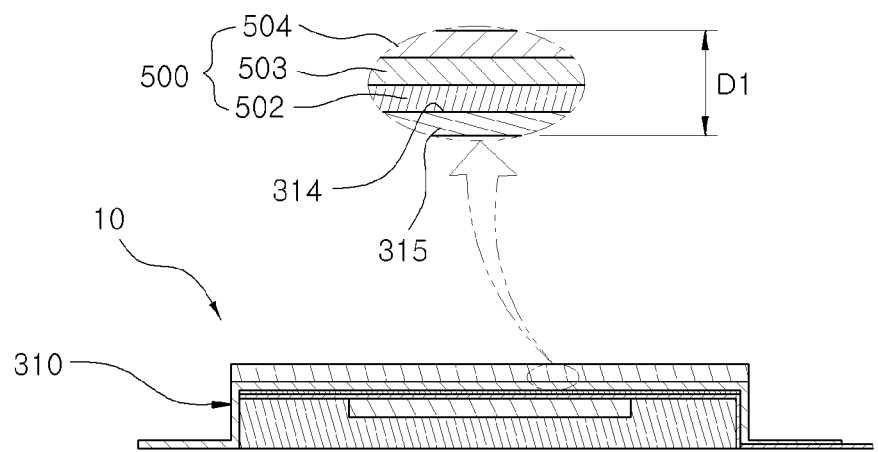
FIGS. 9 and 10 are cross sectional views illustrating the fingerprint sensor module according to one embodiment of the present invention.
Figure 10:
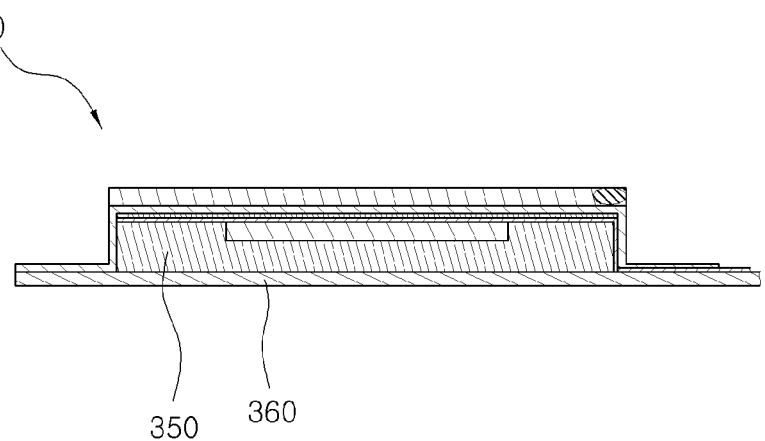

FIGS. 9 and 10 are cross sectional views illustrating the fingerprint sensor module according to one embodiment of the present invention.

As shown in FIGS. 9 and 10, a post-processing layer 500 may be provided on the contact surface 314 of the bracket 310 of the fingerprint sensor module 10.

The post-processing layer 500 serves various functions such as application of colors on the fingerprint sensor module 10, reinforcement of the strength of an upper surface of the fingerprint sensor module 10, etc.

The post-processing layer 500 may include a primer layer 502, a color paint layer 503, and a protective layer 504, and the primer layer 502, the color paint layer 503, and the protective layer 504 may be sequentially formed to be the post-processing layer 500.

The primer layer 502 is provided on the contact surface 314 to connect to the color paint layer 503, and the color paint layer 503 may serve as a color applying function.

The primer layer 502 may be formed to have a thickness of 0.002 to 0.003 mm, and the color paint layer 503 may be formed to have a thickness of 0.003 to 0.005 mm.

Further, the protective layer 504 may be a ceramic coating layer including a UV protective layer or ceramic. The protective layer 504 may be formed to have a thickness of 0.02 to 0.022 mm.

The post-processing layer 500 may be formed to have a thickness of 0.025 to 0.03 mm.

Further, the sum D1 of the thicknesses of the post-processing layer 500 and supporting layer 315 may be in a range of 0.04 to 0.06 mm.

Figure 11:
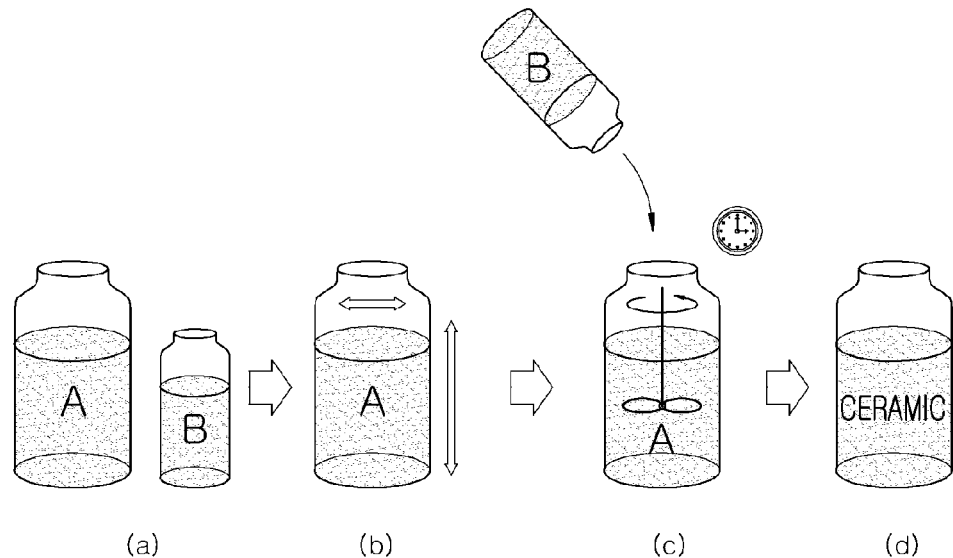
FIG. 11 is a schematic view for describing a process of preparing a ceramic paint using a sol-gel method in the fingerprint sensor module according to one embodiment of the present invention.

FIG. 11 is a schematic view for describing a process of preparing ceramic paint using a sol-gel method in the fingerprint sensor module according to one embodiment of the present invention, and it will be described with reference to FIG. 11 below.

Ceramic paint is prepared for a ceramic coating layer as the protective layer 504. For example, the ceramic paint is prepared using a sol-gel method which prepares ceramic by mixing two or more solutions.

That is, as shown in FIG. 11(A), a solution A and a solution B are prepared. Then, as shown in FIG. 11(B), the solution A is vertically and laterally shaken for a predetermined time, e.g., 30 minutes. Subsequently, as shown in FIG. 11(C), the solution B is added to the solution A and the solutions A and B are mixed for a predetermined time, e.g., 5 hours. When 2K ceramic paint is formed using the above process, as shown in FIG. 11(D), the 2K ceramic paint is fully shaken to use for coating (spraying). The protective layer 504 may be formed by spraying the above-prepared ceramic paint onto the color paint layer 503.

For example, the ceramic paint may be prepared using the sol-gel method as described above, and the ceramic coating layer is formed on the color paint layer using the ceramic paint.

Since a ceramic has high permittivity, a fingerprint sensor may reduce a signal loss when an image is received in an active state thereof. That is, since the ceramic coating layer serves as a dielectric layer, an electric flux generated when a driving signal is transmitted to the fingerprint sensor 200 through a user's finger (not shown) may be densely formed. That is, in the fingerprint sensor module 10 according to one embodiment of the present invention, the loss of a sensing signal can be reduced. Further, the ceramic has high fouling resistance such as anti-fingerprint, water repellency, etc. Accordingly, image blurring caused by surface contamination can be reduced and a clear fingerprint image can be obtained. Further, a mineral pigment having thermal resistance, high hiding power, and weatherability may be added to and mixed with the ceramic paint to implement various colors.

The permittivity of the ceramic coating layer may be predetermined according to an operating frequency of the fingerprint sensor 200, and for example, a permittivity constant may be 5 or more. That is, when a user's finger touches the fingerprint sensor module 10 or closely approaches the fingerprint sensor module 10 so as to recognize a fingerprint thereof, the sensing part (see 210 in FIG. 3) receives a driving signal, which is transmitted to a user's finger, through the user. When a ceramic coating layer having permittivity suitable for a driving frequency of the sensing part 210, i.e., the protective layer 504, is used, the signal is concentrated in the ceramic coating layer and transmitted to an image sensing area. Accordingly, the signal loss can be reduced and the operability of the fingerprint sensor 200 can be improved.

In the embodiment of the present invention, since the protective layer 504 of the post-processing layer 500 is formed with a ceramic coating layer, it can ensure a small thickness, ensure durability of abrasion and thermal resistance, improve the operability of the fingerprint sensor, and also improve the operability of the fingerprint sensor by reducing the signal loss of the fingerprint sensor.

Meanwhile, before the post-processing layer 500 is provided on the contact surface 314 of the bracket 310, a polishing process may be further performed to adjust the thickness of the supporting layer 315 included in the bracket 310 and to increase flatness of the supporting layer. At this time, the polishing process is performed to have a thickness acceptable for sensing by the fingerprint sensor 200, and to this end, the polishing process may be performed so that the thickness of the supporting layer 315 of the bracket 310 is in a range of 0.015 to 0.03 mm. For example, when the thickness of the supporting layer 315 is formed to be 0.1 mm, the polishing process is performed on the supporting layer 315 so that the thickness of the supporting layer 315 is in a range of 0.015 to 0.03 mm.

Further, as shown in FIG. 10, a metal plate 360 may be further provided on the molding material 350. The metal plate 360 may be formed of a stainless steel material. The metal plate 360 may be provided on the molding material 350, encapsulate and support a portion in which the molding material 350 is exposed, and support the fingerprint sensor module 10, and thus, the strength of the fingerprint sensor module 10 may be reinforced.

According to the embodiment described with reference to FIGS. 7 to 10, the flatness of the flexible substrate 201 of the fingerprint sensor 200 can be ensured by fixedly pressing the sensor 200 on the provided bracket 310.

Figure 12:
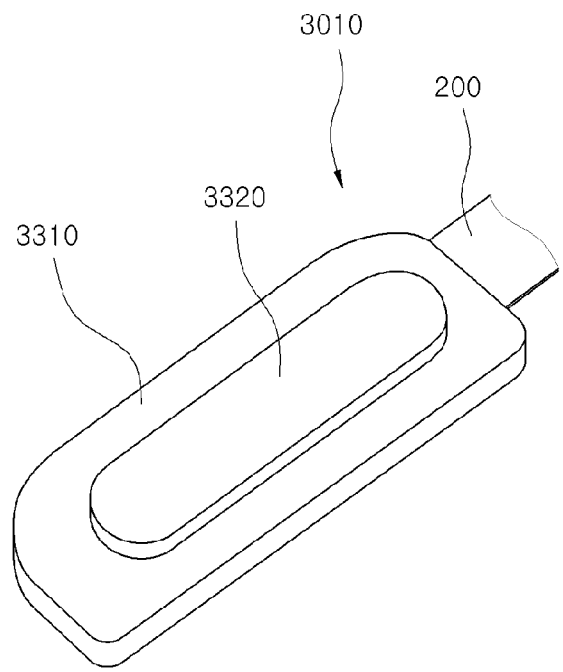
FIG. 12 is a perspective view illustrating the fingerprint sensor module according to another embodiment of the present invention.
Figure 13:
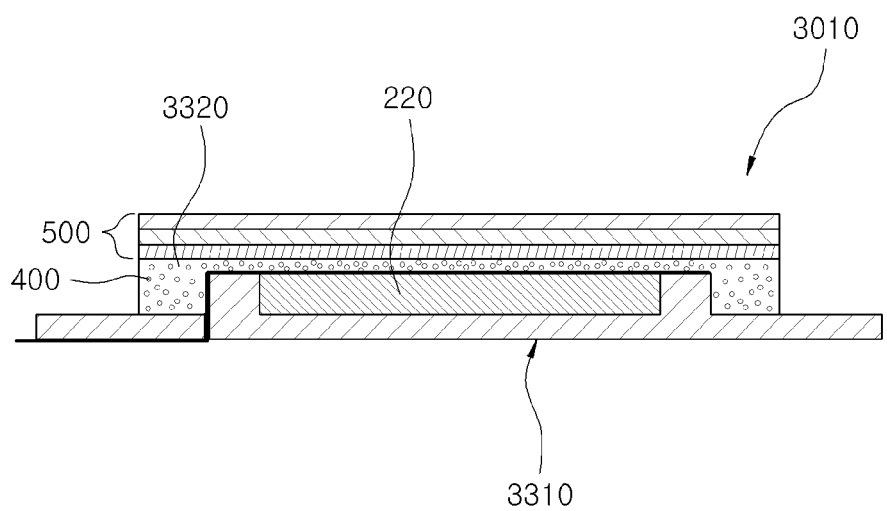
FIG. 13 is a cross sectional view illustrating the fingerprint sensor module according to another embodiment of the present invention.
Figure 14:
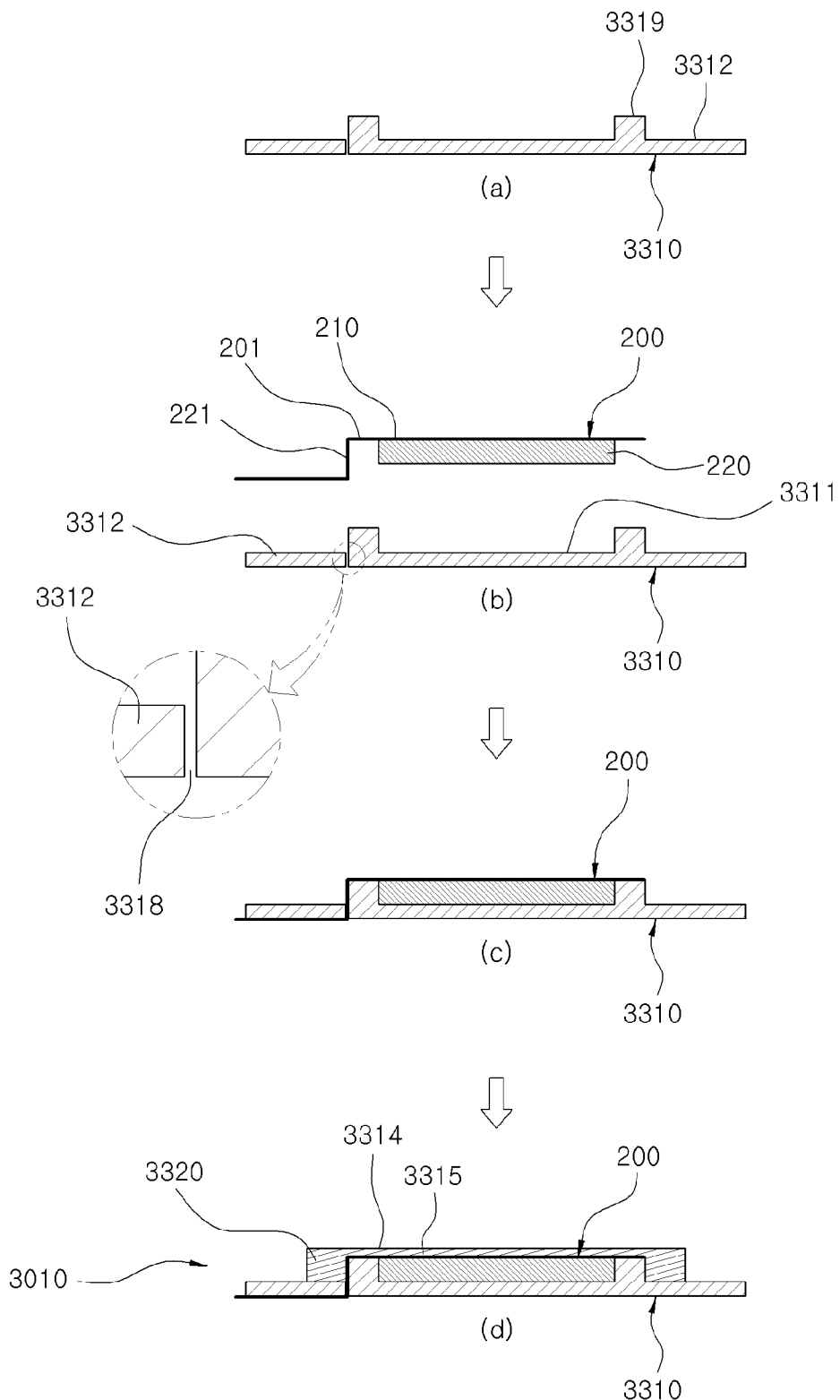
FIG. 14 is a cross sectional view for describing a process of manufacturing the fingerprint sensor module according to another embodiment of the present invention.

FIG. 12 is a perspective view illustrating the fingerprint sensor module according to another embodiment of the present invention. FIG. 13 is a cross sectional view illustrating the fingerprint sensor module according to another embodiment of the present invention. FIG. 14 is a cross sectional view for describing a process of manufacturing the fingerprint sensor module according to another embodiment of the present invention. A fingerprint sensor may be fixed by an additional bracket (a first bracket) in another embodiment, and the description of remaining configurations, which are the same as those described with one embodiment, will be omitted.

As shown in FIGS. 12 to 14, a first bracket 3310 accommodates a sensor circuit part 220 of a fingerprint sensor 200 in a first groove 3311 formed therein, and a sensing part 210 of the fingerprint sensor 200 is upwardly seated by supporting of a flexible substrate 201 disposed on a step difference 3319 formed on an edge of the first groove 3311.

Here, the fingerprint sensor 200 and the first bracket 3310 are attached to each other using epoxy resin or an adhesive tape, and an external interface connection part 221 is disposed to be exposed and extend outside of the first bracket 3310.

Further, a flange 3312, which supports the first bracket 3310 and includes a through-hole 3318 passing through an external interface connection part 221, may be formed. The flange 3312 may be formed to be integrated with the first bracket 3310, i.e., an integrated type, or separated therefrom, i.e., a separate type. In the embodiment of the present invention, the integrated type is formed. Here, a coupling hole (not shown), to which external decorative member (not shown) may be coupled, may be included in the flange 3312.

Here, the through-hole 3318 may be formed at a portion in which the flange 3312 is in contact with a bottom boundary of the first bracket 3310.

Further, an exterior of the flange 3312 may be formed to be wider than a boundary of the first bracket 3310 so as to serve in position fixing in advance for easily processing a subsequent process.

Then, a second bracket 3320 is formed to cover the first bracket 3310 in a state in which the fingerprint sensor 200 is accommodated in the first bracket 3310 and the external interface connection part 221 is inserted into the through-hole 3318. It may be designed to fix the external interface connection part 221 by the second bracket 3320, and to easily attach the fingerprint sensor module on a mobile device. Meanwhile, the second bracket 3320 may be formed to be integrated with the first bracket 3310 as an integrated type while a process is performed.

A supporting layer 3315 may be formed on the second bracket 3320 to cover the sensing part 210 of the fingerprint sensor 200.

Further, after the second bracket 3320 is formed, an additional polishing process may be further performed on a contact surface 3314 of the second bracket 3320. At this time, the polishing process may be performed until a thickness acceptable for sensing by the fingerprint sensor 200 is in a range of 0.015 to 0.03 mm.

Then, after the polishing process is complete, a post-processing layer 500 may be formed on the contact surface 3314. The post-processing layer 500 may be formed to have a thickness of 0.025 to 0.03 mm.

The first bracket 3310, the flange 3312, and the second bracket 3320 may be formed of one of an EMC, fluoride resin, and nylon or polyamide including 20 to 40% glass.

Further, the supporting layer 3315 of the second bracket 3320 may include a ferroelectric 400, and the ferroelectric 400 may be further included in the entire second bracket 3320.

Further, the second bracket 3320 is coupled by a physical method, or coupled by molding such as insert molding.

A fingerprint sensor module 3010, in which the first bracket 3310 is coupled with the fingerprint sensor 200 and the second bracket 3320, may be processed on a substrate as a plurality and divided into individual modules through a sawing process.

Figure 15:
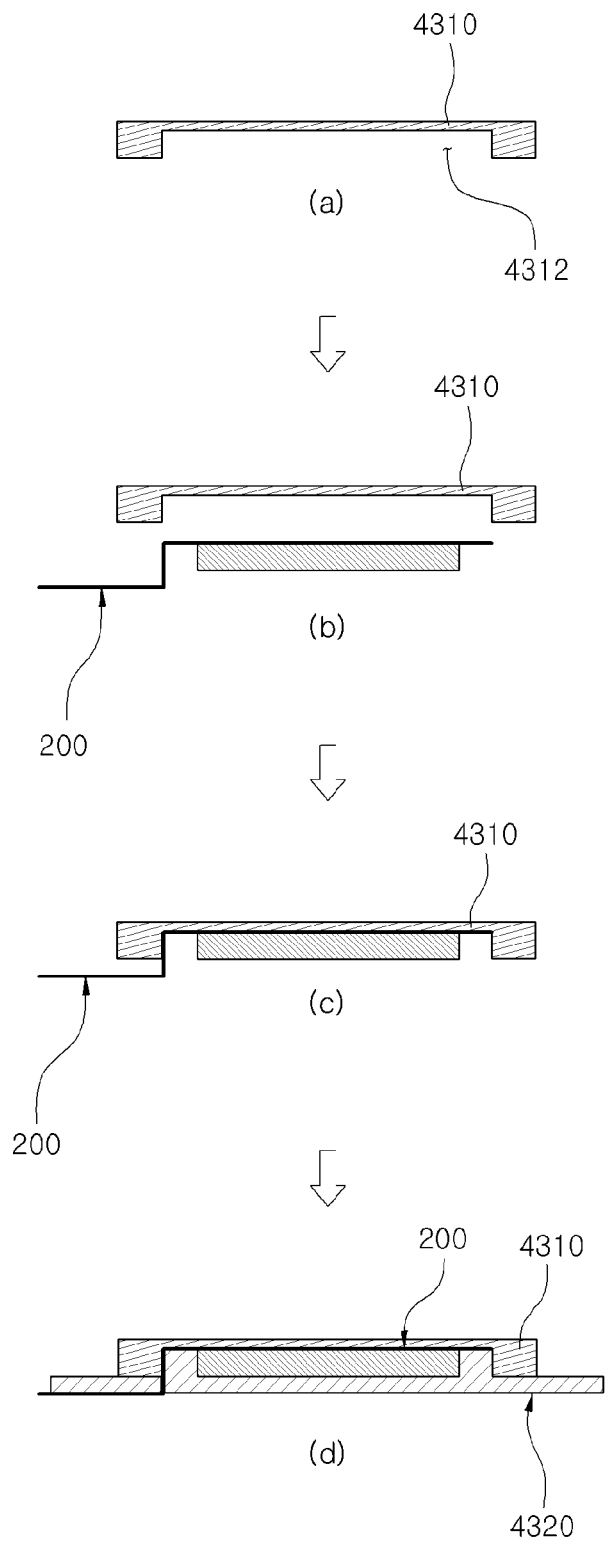
FIG. 15 is a cross sectional view for describing a process of manufacturing a fingerprint sensor module according to still another embodiment of the present invention.

Meanwhile, FIG. 15 is a cross sectional view for describing a process of manufacturing a fingerprint sensor module according to still another embodiment of the present invention. In the embodiment of the present invention, a fingerprint sensor may be first accommodated in a groove of a bracket, and an additional bracket may be inserted into and coupled with the groove.

That is, as shown in FIGS. 15(A) to 15(C), a fingerprint sensor 200 may be first accommodated in a groove 4312 of a bracket 4310 and seated in the bracket 4310. Here, the bracket 4310 corresponds to the second bracket 3320 shown in FIG. 14.

Further, an additional bracket 4320 may be inserted into and coupled with an empty space of the groove 4312 of the bracket 4310. Here, the additional bracket 4320 corresponds to the first bracket 3310 shown in FIG. 14.

That is, the manner, in which the fingerprint sensor 200 is inserted into the groove 4312 of the bracket 4310, and then, the additional bracket 4320 is coupled with the groove 4312 to fix the fingerprint sensor 200 according to still another embodiment of the present invention, and the manner, in which the fingerprint sensor 200 is seated in the groove 312 of the bracket 310 described with reference to FIGS. 7 and 8, and then, the fingerprint sensor 200 is fixed with a molding material 350, have a common concept.

Further, the manner, in which the fingerprint sensor 200 is fixed by the separate bracket 4310 and the additional bracket 4320 formed with molding products according to still another embodiment of the present invention, and the manner, in which the fingerprint sensor 200 is fixed by the separate first bracket 3310 and second bracket 3320 formed with molding products as described with reference to FIG. 14, have a common concept.

The above description exemplarily describes the present invention and one skilled in the art may understand that the present invention can be easily modified into another concrete form without changing the technical spirit or the essential features of the present invention. Therefore, it should be understood that the above-described exemplary embodiments are only the examples in all aspects and the present invention is not limited thereto. For example, each structural element which is described as single member may be formed as separated elements. Similarly, structural elements which are described as separated members may be formed as single element.

The scope of the present invention is represented by the following claims, rather than the above detail description, and it should be understood that the meaning and the scope of claims and all modified or changed forms derived from claims and their equivalents are fallen within the scope of the present invention.

[Industrial Applicability]

The invention claimed is:

1. A fingerprint sensor module for a portable electronic device, the fingerprint sensor module comprising:
   a fingerprint sensor comprising a sensing part formed on a substrate using a conductor, and a sensor circuit part electrically connected to the sensing part; and
   a post-processing layer disposed on an upper portion of the sensing part,
   wherein a thickness from an upper surface of the sensing part to an upper surface of the post-processing layer is in a range of 0.04 to 0.06 mm.

2. The fingerprint sensor module of claim 1, wherein the post-processing layer comprises a primer layer, a color paint layer, and a protective layer.

3. The fingerprint sensor module of claim 2, wherein:
   the primer layer has a thickness of 0.002 to 0.003 mm;
   the color paint layer has a thickness of 0.003 to 0.005 mm; and
   the protective layer has a thickness of 0.02 to 0.022 mm.

4. A portable electronic device comprising the fingerprint sensor module for a portable electronic device according to claim 3.

5. A portable electronic device comprising the fingerprint sensor module for a portable electronic device according to claim 2.

6. A portable electronic device comprising the fingerprint sensor module for a portable electronic device according to claim 1.

7. A method of manufacturing a fingerprint sensor module for a portable electronic device, the method comprising:
   forming a sensing part on a substrate of a fingerprint sensor using a conductor; and
   forming a post-processing layer on an upper portion of the sensing part, wherein a thickness from an upper surface of the sensing part to an upper surface of the post-processing layer is in a range of 0.04 to 0.06 mm.

8. The method of claim 7, wherein the forming of the post-processing layer comprises sequentially forming a primer layer, a color paint layer, and a protective layer.

9. The method of claim 8, wherein:
the primer layer has a thickness of 0.002 to 0.003 mm;
the color paint layer has a thickness of 0.003 to 0.005 mm; and
the protective layer has a thickness of 0.02 to 0.022 mm.

* * * * *